United States Patent [19]
Corsi et al.

[11] 3,943,341
[45] Mar. 9, 1976

[54] COMPUTING APPARATUS

[76] Inventors: Gianfranco Corsi; George Michael Watson, both of 8, Princesway, Team Valley, Gateshead, Durham, England

[22] Filed: Apr. 1, 1974

[21] Appl. No.: 456,897

[30] Foreign Application Priority Data
Apr. 9, 1973  United Kingdom.............. 16838/73

[52] U.S. Cl. ........ 235/150.52; 235/150.3; 235/196; 235/92 DM
[51] Int. Cl.² ......................................... G06J 1/00
[58] Field of Search......... 235/150.5, 150.52, 150.3, 235/151.35, 92 CP, 92 T, 92 TF, 92 CA, 92 DM, 92 PE, 92 CC, 92 FQ, 196; 204/180 R, 299

[56] References Cited
UNITED STATES PATENTS

| | | | |
|---|---|---|---|
| 3,103,578 | 9/1963 | Dietrich, Jr. .............. | 235/150.52 X |
| 3,600,563 | 8/1971 | Porter et al. ................... | 235/150.3 |
| 3,609,326 | 9/1971 | Bagley .......................... | 235/92 DM |
| 3,681,586 | 8/1972 | Kitaura ......................... | 235/194 X |
| 3,739,156 | 6/1973 | Gebelein, Jr. et al. .......... | 235/150.3 |

*Primary Examiner*—Joseph F. Ruggiero
*Attorney, Agent, or Firm*—Alfred H. Rosen; Frank A. Steinhilper

[57] ABSTRACT

Computing apparatus for producing a digital output equal to $$N_1 \frac{V_1}{V_2}.$$

where $N_1$ is a preset digital factor and $V_1$ and $V_2$ are analogue input signals. The apparatus includes a pulse generator arranged to receive in turn each of the signals $V_1$ and $V_2$ and to generate pulses at a frequency proportional to the magnitude of the signal, a counter for counting pulses received from the generator, timing means for measuring the time T taken for the count in the counter to reach the value $N_1$ when signal $V_1$ is applied to the pulse generator, means for resetting the counter, and means for extracting the count in the counter after a time equal to time T has elapsed during a counting operation with signal $V_2$ applied to the pulse generator.

9 Claims, 2 Drawing Figures

COMPUTING APPARATUS

THIS INVENTION relates to computing apparatus.

According to this invention there is provided computing apparatus for providing a digital output proportional to the ratio of the magnitudes of two analogue input signals multiplied by a predetermined digital factor, comprising a pulse generator adapted to receive in turn each of the analogue input signals and to generate pulses at a frequency proportional to the magnitude of the input signal, a counter connected to the pulse generator and adapted to count pulses received therefrom, timing means adapted to measure the time elapsed from the beginning of a counting operation of the counter, a store adapted to store the value of the elapsed time measured by the timing means when, during supply of one of the two analogue input signals to the pulse generator, the count in the counter reaches a value equal to the predetermined digital factor, means for resetting the counter, the counter providing the required output when, during supply of the other analogue input signal to the pulse generator, the time elapsed from the beginning of the counting operation is equal to the value held in the store.

Suitably, the timing means comprises a second pulse generator adapted to supply pulses at fixed frequency to a second counter, and the store is adapted to receive a count transferred from the second counter.

Preferably, the predetermined digital factor can be varied in response to a manual input to the apparatus.

The analogue input signals may, for example, be voltage signals representing respectively the total mass of protein and masses of individual proteins derived from a photometric scan of an electrophoresis strip obtained in an electrophoresis evaluation of a protein sample.

One embodiment of the invention will now be described, by way of example, with reference to the accompanying drawing, in which.

Figure 1:
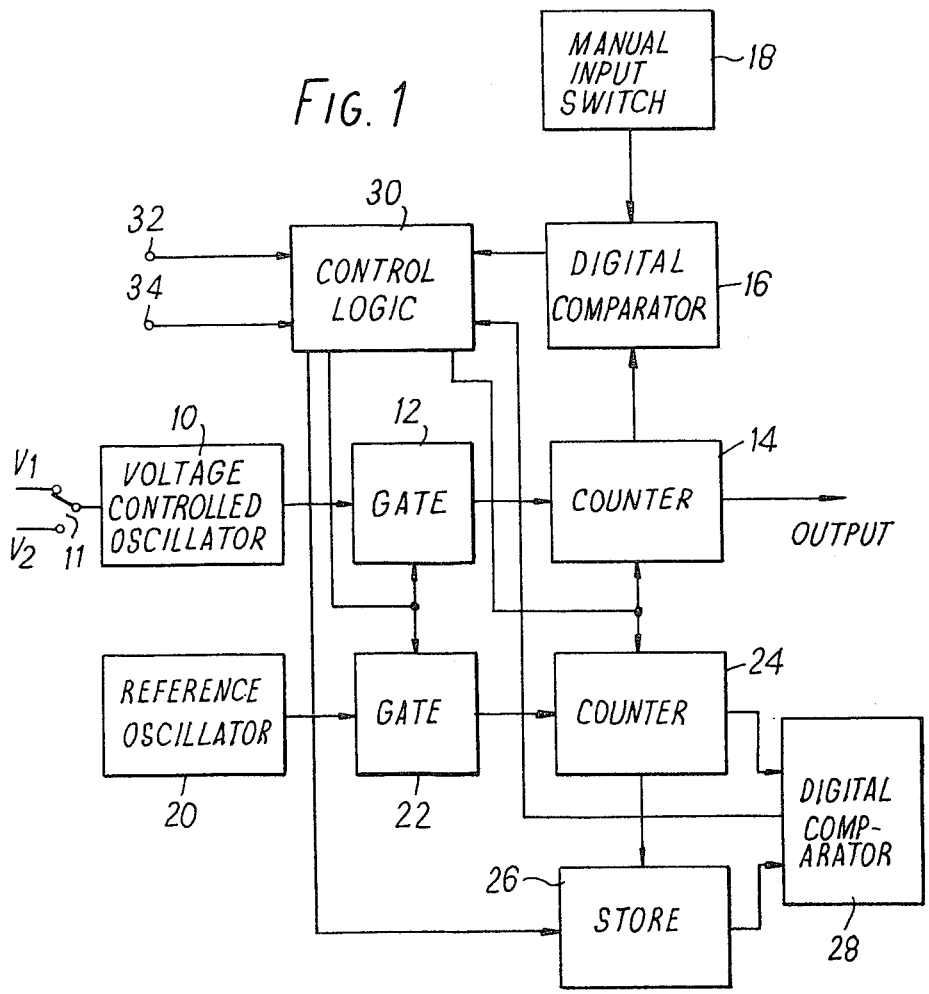
FIG. 1 is a block diagram of apparatus according to the invention.
Figure 2:
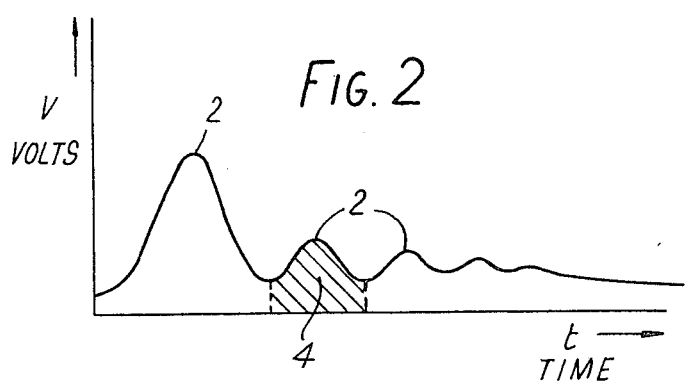
FIG. 2 is a graph of an electrical voltage signal derived from a photometric scan of a protein electrophoresis sample.

The apparatus shown in FIG. 1 forms part of equipment for computing individual protein masses from a sample subject to an electrophoresis process. The equipment includes conventional photometric apparatus for scanning an electrophoresis strip and producing a voltage signal proportional to the light absorbance of each part of the sample as it passes through the light beam of the photometric apparatus. A typical form of the voltage signal generated is shown in FIG. 2, each peak 2 correspondence to the presence of an individual protein on the electrophoresis strip. The equipment also includes integration apparatus adapted to measure the area under each peak of the graph, e.g. the area shown hatched at 4 in FIG. 2, and the total area under the graph and to generate voltages proportional to these areas. These areas are respectively proportional to the masses of individual proteins and the total mass of the protein sample. Thus, if the integration apparatus generates a voltage $V_1$ proportional to the total area under the graph and a voltage $V_2$ proportional to the area under an individual peak, and if the total protein mass (which may be separately measured in any suitable manner) is $N_1$, then the mass of the individual protein represented by the peak is given by $$N_2 = \frac{V_2}{V_1} \cdot N_1 .$$

Referring to FIG. 1, apparatus for computing the value of $N_2$ comprises a variable-frequency oscillator 10 which generates pulses at a frequency proportional to an input voltage applied to the oscillator through a switch means 11, the pulses being supplied through a gate 12 to a first counter 14. The count in counter 14 is compared by a digital comparator 16 with a number, corresponding to the value $N_2$, which can be manually set by means of a multi-position switch 18, which may be of the type commonly known as a thumbwheel switch. The output of comparator 16 is supplied to the control logic 30 of the apparatus. A reference oscillator 20 supplies pulses at fixed frequency, through gate 22, to a second counter 24, the oscillator thus acting as a reference clock. The count in counter 24 can be transferred to a digital store 26, and the count stored in 26 can be compared with a subsequent count in counter 24 by a second digital comparator 28, the output of which is supplied to the control logic 30.

In operation, thumbwheel switch 18 is manually set to a number corresponding to the total protein mass. Voltage $V_1$, corresponding to the total area under the graph of FIG. 2, is applied to the input of oscillator 10 through switch 11, after a scan of the electrophoresis strip has been completed and the total area integral computed. A signal supplied through an input line 32 to control logic circuitry 30 causes it to supply resetting signals to both counters 14 and 24, and subsequently to open gates 12 and 22, so that pulses from the oscillators are supplied to counters 14 and 24, the frequency of pulses supplied by oscillator 10 being proportional to the voltage $V_1$. When the count of the first counter 14 has reached a value equal to the number set by thumbwheel switch 18, the comparator 16 supplies a signal to control logic 30, which then causes gates 12 and 22 to close, and subsequently causes the count in counter 24 to be transferred to store 26. This latter count represents the time taken for the count in counter 14 to reach the value set by the thumbwheel switch, this time being proportional to the value of $$\frac{N_1}{V_1} .$$

The voltage $V_2$ is then supplied to oscillator 10 in place of voltage $V_1$, and a signal supplied through line 34 to control logic 30 causes it to supply resetting pulses to the counters 14 and 24 and subsequently to open gates 12 and 22. Pulses are thus again supplied by the oscillators to the counters, the frequency of pulses supplied to counter 14 being proportional to voltage $V_2$. When the count in counter 24 becomes equal to the count stored in store 26, comparator 28 supplies a signal to the control logic which causes gates 12 and 22 to close. Since at this point the time elapsed since the beginning of the counting cycle is the same as the elapsed time in the first cycle, the count in the first counter 14 at this point is equal to $$V_2 \cdot \frac{N_1}{V_1} .$$

The output taken from counter 14 at this point therefore gives the desired calculated value.

The second cycle can be repeated with input voltages $V_2$ derived from the other peaks of the graph, the stored value representing $N_1/V_1$ remaining the same.

If the switch 18, instead of being set to a number corresponding to the total protein mass is set to a number corresponding to the factor 100, the output of the apparatus will be $$100 \cdot \frac{V_2}{V_1},$$

i.e. the individual protein mass expressed as a percentage of the total protein mass.

The described computing apparatus may be used with apparatus of the kind described in co-pending application Ser. No. 457,848 filed Apr. 4, 1974, in place of or in addition to the analogue computing circuitry shown therein. The apparatus of the co-pending application includes a scanning mechanism for photometric scanning of an electrophoresis strip, circuitry for detecting minima or "troughs" in a voltage curve produced in response to the photometric scan, and an integrator for calculating the area beneath each peak of the curve and the total area beneath the curve. In that case, the signal to control line 32 may be derived from the scanning mechanism, the signal being provided automatically when the mechanism has completed a scan across the strip in each direction, and the signal to control line 34 may be derived from the trough detector circuitry, the detection of a trough indicating that a peak has just been scanned and that the output of the integrator at that instant indicates the area under that peak. Switch 11 may similarly be actuated automatically in response to control signals derived from the scanning mechanism.

We claim:

1. Computing apparatus for providing a digital output proportional to the ratio of the magnitudes of two analogue input signals multiplied by a predetermined digital factor, comprising a pulse generator for receiving in turn each of the analogue input signals and for generating pulses at a frequency proportional to the magnitude of the input signal, a counter connected to the pulse generator for counting pulses generated thereby, timing means for measuring the time elapsed from the beginning of a counting operation of the counter, store means for storing the value of the elapsed time measured by the timing means when, during a first counting operation with one of the analogue signals supplied to the pulse generator, the count in the counter reaches a value equal to the predetermined digital factor, means for re-setting the counter, and means for providing an output equal to the count in the counter when, during the subsequent supply of the other analogue signal to the pulse generator, the time elapsed from the beginning of a further counting operation is equal to the value held in the store means.

2. Computing apparatus as claimed in claim 1, in which the timing means comprises a second pulse generator for generating pulses at a constant frequency, and counting means for counting pulses generated by the second pulse generator.

3. Computing apparatus as claimed in claim 2, in which the counting means is a second counter and the store means comprises a separate store connected to the second counter so as to receive and store the count held therein when the count in the first counter is equal to the predetermined digital factor, there being provided means for resetting the second counter after transfer of the count to the store.

4. Computing apparatus as claimed in claim 3, in which there is provided a digital comparator connected to the second counter and the store for providing a control signal to control circuitry of the apparatus when, during said further counting operation, the count in the second counter equals the value held in the store.

5. Computing apparatus as claimed in claim 1 in which the predetermined digital factor is variable in response to a manual input to the apparatus.

6. Computing apparatus as claimed in claim 5, in which there is provided a manually settable device adapted to store the predetermined digital factor.

7. Computing apparatus as claimed in claim 6, in which there is provided a digital comparator connected between the manually settable device and the first counter for providing a control signal to control circuits of the apparatus when the count in the counter is equal to the factor stored in the device.

8. Computing apparatus as claimed in claim 7, in which the manually settable device is a multi-position switch.

9. Computing apparatus as claimed in claim 1, for receiving analogue voltage signals, in which the pulse generator is a voltage controlled oscillator.

* * * * *